United States Patent [19]

Coe

[11] Patent Number: 4,580,154
[45] Date of Patent: Apr. 1, 1986

[54] INSULATED-GATE FIELD-EFFECT TRANSISTORS

[75] Inventor: David J. Coe, East Grinstead, England

[73] Assignee: U.S. Philips Corporation, New York, N.Y.

[21] Appl. No.: 533,339

[22] Filed: Sep. 19, 1983

[30] Foreign Application Priority Data

Sep. 22, 1982 [GB] United Kingdom ................ 8227002

[51] Int. Cl.$^4$ ..................... H01L 29/78; H01L 27/02
[52] U.S. Cl. ............................... 357/23.4; 357/23.1; 357/23.3; 357/23.9; 357/43
[58] Field of Search ................ 357/23.4, 23.9, 23.1, 357/23.3, 43

[56] References Cited

U.S. PATENT DOCUMENTS 4,502,070 2/1985 Leipold et al. ..................... 357/23.4

OTHER PUBLICATIONS

Tihanyi, J., *Functional Integration of Power MOS and Bipolar Devices*, Intern't. Electr. Devices Meeting, Dec. 8, 1980.

Primary Examiner—Martin H. Edlow
Assistant Examiner—Terri M. Henn
Attorney, Agent, or Firm—Robert T. Mayer; Steven R. Biren

[57] ABSTRACT

An insulated-gate field-effect transistor which may be of a vertical power D-MOS type includes surface-adjacent source and emitter regions surrounded in a semiconductor body by a surface-adjacent second region of opposite conductivity type. A third region adjoins the second region and has a lower conductivity-type determining doping concentration. At least a part of these second and third regions is located in a main current path from the source region to a drain of the transistor, and an insulated gate, which may be of metal-silicide, capacitively controls a conductive channel at least in this part of the second region. The emitter region is located at a side of the source region remote from the channel part and is separated therefrom by an intermediate part of the second region. The source region is electrically connected to this intermediate part, for example by a short-circuiting metal-silicide layer. A resistive current path in the second region is present below the emitter region and extends from this intermediate part to a further part of the second region which is electrically connected to the emitter region, for example by a short-circuiting metal-silicide layer. A source electrode is electrically connected to this further part so as to be electrically connected via the resistive current path to the source region. The emitter region serves to modulate the conductivity of the third region and thus reduce the drain series resistance of the transistor, by charge-carrier injection from the intermediate part when the source-drain current along the resistive current path is sufficient to forward-bias the intermediate part with respect to the third region.

8 Claims, 2 Drawing Figures

INSULATED-GATE FIELD-EFFECT TRANSISTORS

BACKGROUND OF THE INVENTION

This invention relates to insulated-gate field-effect transistors, particularly but not exclusively of the vertical power D-MOST type or V-MOST type, having reduced drain series resistance.

The paper entitled "Functional Integration of Power MOS and Bipolar Devices" by J. Tihanyi, International Electron Devices Meeting, 1980, Washington D.C., I.E.E.E. publication CH 1616-2/80/0000-0075, pages 75 to 78, describes several insulated-gate field-effect power transistors comprising a semiconductor body having a surface-adjacent source region of one conductivity type which is surrounded in the body by a surface-adjacent second region of the opposite conductivity type. A third region adjoins the second region and has a lower conductivity-type determining doping concentration. At least a part of said second and third regions is located in a main current path from the source region to a drain of the transistor. A conductive layer is present on an insulating layer on said part of at least the second region to form an insulated gate of the transistor for capacitively controlling in said part a conductive channel in the main current path between the source region and the drain. The principal field-effect transistors described in this paper are of so-called SIPMOS construction which is an ion-implanted variant form of the D-MOST type. It should be noted that the designation MOST is commonly used for insulated-gate field-effect transistors and does not imply that the gate is necessarily a metal nor that the gate insulator is necessarily an oxide. Thus, for example, the described SIPMOS transistors have gates of doped polycrystalline silicon.

Insulated-gate field-effect transistors have advantageous low drive and fast switching characteristics. However, compared with a bipolar power transistor of the same area, an insulated-gate field-effect power transistor has a lower on-conductance (high series resistance) at blocking voltages of about 300 volts and above. This lower on-conductance results from the very high parasitic series resistance of the low-doped (third) region which is associated with the drain of the transistor. Various attempts have been made to combine the low drive and fast switching characteristics of an MOST with the low on-conductance of a bipolar device.

The paper by J. Tihanyi describes various combinations of a SIPMOS transistor and a bipolar device. FIG. 3a of said paper shows one such combination in which (in addition to the previously-mentioned SIPMOS features) a surface-adjacent emitter regin of said one conductivity type is also surrounded in the body by the second region, said emitter region being located at a side of the source region remote from the channel part of the second region and being separated from the source region by an intermediate part of the second region. The source region is electrically connected to said intermediate part. A resistive current path in the second region is present below the emitter region.

The device combination of FIG. 3a of said paper is a lateral MOS-thyristor, the emitter region being a cathode of the thyristor, and an anode region being provided in the low-doped third region. A cathode electrode which contacts the cathode emitter region also contacts the source region and the intermediate part of the second region so as to short-circuit the cathode and source regions to the second region. The cathode-anode path of the thyristor is the main current-carrying path of the combined device, and the MOST is used to trigger the thyristor by supplying its drain current as the firing current to the third region which forms the low-doped n-type base of the thyristor. The forward-biased junction between the anode region and the third region injects minority carriers (holes) which diffuse through the third region to the second region and cause the latching of the device. By thus using the MOST gate as the input of the combined device, only a low input current is needed to switch the structure on. In this manner a bipolar device is given advantageous MOST characteristics.

SUMMARY OF THE INVENTION

The present invention relates to a different approach in combining a bipolar emitter region with an insulated-gate field-effect power transistor, in which the source-drain path of the transistor provides a main current-carrying path of the combined device while the bipolar emitter region serves to reduce the series resistance by modulating the conductivity of the third region by charge-carrier injection.

Thus, according to the present invention, there is provided an insulated-gate field-effect transistor comprising a semiconductor body having a surface-adjacent source region of one conductivity type which is surrounded in the body by a surface-adjacent second region of the opposite conductivity type, a third region adjoining the second region and having a lower conductivity-type determining doping concentration, at least a part of said second and third regions being located in a main current path from the source region to a drain of the transistor, a conductive layer being present on an insulating layer on said part of at least the second region to form an insulated gate of the transistor for capacitively controlling in said part a conductive channel in the main current path between the source region and the drain, a surface-adjacent emitter region of said one conductivity type also being surrounded in the body by the second region, said emitter region being located at a side of the source region remote from the channel part of the second region and being separated from the source region by an intermediate part of the second region, the source region being electrically connected to said intermediate part, and a resistive current path in the second region being present below the emitter region, characterized in that said resistive current path extends from said intermediate part to a further part of the second region which is electrically connected to the emitter region, in that a source electrode is electrically connected to said further part of the second region so as to be electrically connected via said resistive current path to the source region, and in that the emitter region serves to modulate the conductivity of the third region by charge-carrier injection from said intermediate part of the second region when the source-drain current along the resistive current path is sufficient to forward-bias said intermediate part with respect to the third region.

Such a power transistor structure can have a compact geometry and layout of the various regions, connections and electrodes while providing a significant increase in the on-conductance of the field-effect transistor by the carrier injection which modulates the conductivity of the third region which is located in the main current path to the drain of the transistor. The emitter region may be regarded as forming with the second and third regions a bipolar transistor structure which is merged with the insulated-gate field-effect transistor. As a result of the electrical connection between the emitter region and said further part to which the resistive current path below the emitter region extends from the intermediate part of the second region, significant carrier injection in the bipolar transistor structure only begins to occur at moderately high current levels and there is a progressive lateral spread of the conductivity-modulated (collector) region in the low-doped third region associated with the drain. The degree of conductivity modulation can be determined by choosing the values for the relative active areas of the field-effect and bipolar transistor structures and the areas of the source and emitter regions which are connected to the second region.

Various power transistor layout geometries may be used for such transistors in accordance with the invention. Thus, for example, an interdigitated arrangement of the gate and source electrode may be used at the front surface of the body while providing a drain electrode over the back surface. In such an interdigitated arrangement the active edge lengths of the source region, the gate and the emitter region may be approximately equal. In a presently-preferred form, said further part of the second region is laterally surrounded by the emitter region which is laterally surrounded in the second region by the source region. In this form the source and emitter regions can have concentric annular geometries of any suitable shape, for example square, hexagonal or triangular, which permits a plurality of such regions to be closely packed together for efficient use of the active area of the body, and the active edge length of the source region and gate can be significantly greater than that of the emitter region so that a particularly favorable balance between the insulated-gate field-effect transistor and the bipolar transistor can be obtained.

BRIEF DESCRIPTION OF THE DRAWING

An embodiment of the present invention will now be described by way of example with reference to the accompanying drawing, in which.

Figure 1:
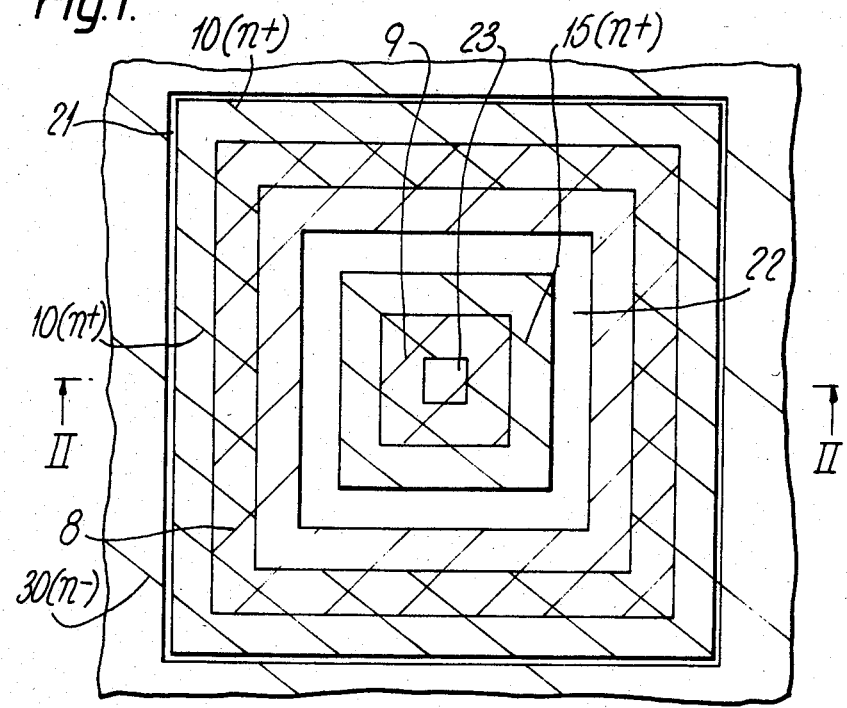
FIG. 1 is a plan view of a surface part of the semiconductor body of an insulated-gate field-effect power transistor in accordance with the invention.

It should be noted that the Figures are diagrammatic and not drawn to scale. The relative dimensions and proportions of some parts of these Figures (particularly in the thickness of these parts) have been shown exaggerated or reduced for the sake of clarity and convenience in the drawing. To aid the understanding of the plan view of FIG. 1 the n-type regions and metal-silicide regions have been hatched in opposite directions, whereas the p-type regions are not hatched. This same hatching style has been used for the n-type, p-type and metal-silicide regions of the cross-sectional view of FIG. 2.

DESCRIPTION OF THE PREFERRED EMBODIMENTS

Figure 2:
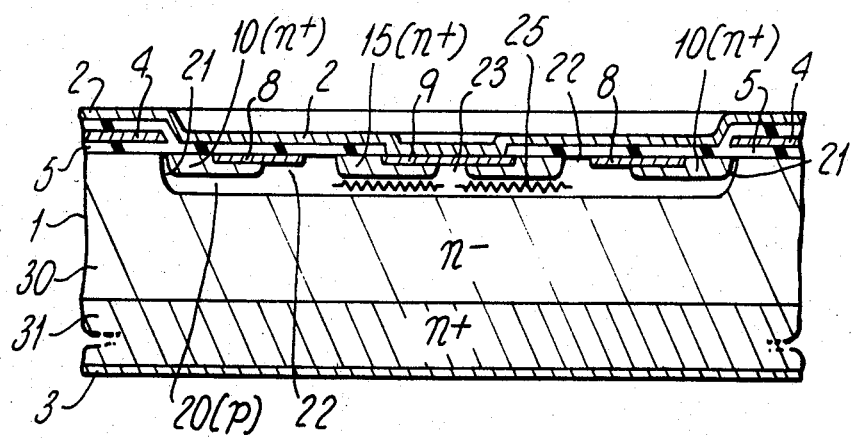
FIG. 2 is a cross-sectional view of the part of the transistor of FIG. 1, taken on the line II—II of FIG. 1.

The insulated-gate field-effect power transistor of FIGS. 1 and 2 is of a vertical D-MOS type and comprises a monocrystalline silicon semiconductor body 1 having an n-type surface-adjacent source region 10 surrounded in the body 1 by a p-type surface-adjoining second region 20. A third region 30 of n-type conductivity adjoins the p-type region 20 and has a lower conductivity-type determining doping concentration than the regions 10 and 20. This low-doped region 30 is associated with the drain of the transistor and constitutes a drain drift region. A highly-doped n-type drain region 31 is present between the region 30 and the opposite major surface of the body 1 from the regions 10, 20 and 30. This drain region 31 is provided by a low-resistivity substrate which has metallization 3 on its back surface forming a drain electrode at this opposite major surface of the body. A low-doped high resistivity n-type epitaxial layer is present on the substrate 31 to provide the drain drift region 30. The regions 10 and 20 are formed by locally overdoping this epitaxial layer.

A conductive layer 4 is present on an insulating layer 5 on a part 21 of the p-type region 20 to form an insulated gate of the transistor for capacitively inducing and controlling in the part 21 an n-type conductive channel between the source region 10 and a surface-adjoining part of the drain drift region 30. The layer 5 may be of silicon dioxide or any other suitable dielectric. In spite of the designation "D-MOS", the gate layer 4 need not be of metal, and may be for example doped polycrystalline silicon. As will be described hereinafter it is advantageous to form the gate layer 4 of a metal silicide. Being a vertical D-MOS structure, the current flow from source to drain in the transistor of FIGS. 1 and 2 is laterally below the gate 4 between the source region 10 and the drain drift region 30 and then vertically through the drain drift region 30 to the underlying highly-doped drain region 31. Thus, the second region part 21 and the third region 30 are located in the main current path from the source region 10 to the drain of the transistor.

FIGS. 1 and 2 illustrate only one cell of the power transistor, whereas in practice a plurality of such cells are formed adjacent each other in the semiconductor body 1 and the gate 4 and the gate insulating layer 5 extend from one cell to the next. Towards the periphery of the body the insulating layer is much thicker to form a field area around the active transistor area comprising the cells. External connections, for example by wire-bonding, are made in this field area to contact pads of the gate 4 and source electrode 2. Since such a field area is well-known for power transistors it is not shown in the drawings and will not be further described.

Each cell of the power transistor of FIGS. 1 and 2 further comprises a surface-adjacent emitter region 15 which is of the same conductivity type, doping concentration and thickness as the source region 10 and is also surrounded in the body 1 by the p-type second region 20. The emitter region 15 is located at a side of the source region 10 remote from the channel part 21 of the region 20 and is separated from the source region 10 by an intermediate part 22 of the region 20. The source region 10 is electrically connected to this intermediate part 22 by a short-circuiting conductive layer 8. A resistive current path 25 in the region 20 is present below the emitter region 15. This path 25 is provided by the part of the region 20 below the emitter region 15.

In accordance with the present invention, this resistive current path 25 extends from the intermediate part 22 of the region 20 to a further part 23 of the region 20, and this further part 23 is electrically connected to the emitter region 15 by a short-circuiting conductive layer 9. Via a contact window in the insulating layer 5 and the layer 9, the source electrode 2 is electrically connected to this further part 23 of the region 20 (as well as to the emitter region 15) so as to be electrically connected via the resistive current path 25 to the source region 10. The emitter region 15 which forms an injecting p-n junction with the part 22 of the region 20 serves to modulate the conductivity of the low-doped drain drift region 30 by charge-carrier injection from the part 22 when the source-drain current along the resistive current path 25 is sufficient to forward-bias the p-type part 22 with respect to the n-type region 30.

In the insulated-gate field-effect transistor of FIGS. 1 and 2, the emitter region 15 effectively forms with the regions 20 and 30 an n-p-n bipolar transistor structure which is merged with the field-effect transistor structure. The major proportion of the total device current between the electrodes 2 and 3 is carried by the relatively large D-MOS transistor, flows between the source and drain regions 10 and 31 and is controlled in the channel part 21 by field-effect action by means of the insulated gate 4. The emitter-base junction of the bipolar transistor is heavily shorted both directly at the electrode 2 and layer 9 and indirectly at the layer 8 so that at low current levels substantially no carrier injection occurs in the bipolar transistor. It is only at higher current levels sufficient to forward-bias the p-n junction between the regions 20 and 30 that this heavily-shorted bipolar transistor begins to saturate partially and to inject. The potential distribution along the path 25 below the emitter region 15 ensures that the injection begins at the side of the emitter region 15 facing the source region 10 and gives a close control of the progressive lateral spread of the conductivity-modulation in the drain drift region 30 as the source-drain current increases. The emitter region 15 injects electrons into the part 22 of the p-type region, and when the part 22 becomes forward-biassed with respect to the region 30 holes are injected into this drain drift region 30. This also increases the electron concentration in the low-doped drain drift region 30 to maintain quasi charge neutrality. The resulting conductivity modulation of the region 30 reduces the series resistance of the field-effect transistor, thus increasing its on-conductance.

The degree of conductivity modulation is determined by the relative areas of the insulated-gate field-effect transistor, the bipolar transistor and the short-circuits. This therefore depends on the particular lateral geometry chosen for the device. FIG. 1 illustrates an annular configuration in which the field-effect transistor is located around the bipolar transistor, so that the former can have a large area while the latter is of small area but still highly effective for conductivity modulation of the active portion of the drain drift region 30. This provides a more favorable balance between the emitter and gate lengths than can be obtained by interdigitating the gate with the source and emitter region combination of a device in accordance with the invention. Although FIG. 1 illustrates a square geometry it should be understood that other annular geometries may easily be used, for example hexagonal or triangular. The part 23 of the region 20 is laterally surrounded by the emitter region 15 which is laterally surrounded in the second region 20 by the source region 10. The short-circuiting layer 9 at the part 23 serves to extract the injected minority carriers, thus reducing the turn-off delay of the transistor. All the active transistor cells of this annular configuration in the body 1 have a common source electrode metallization layer 2 which extends over the gate 4 which is in the shape of a mesh, the layer 2 being insulated from the gate 4 by an electrically insulating layer deposited on the gate 4. The source electrode layer 2 is also insulated by the insulating layer from the source region 10, parts 21 and 22 of the region 20 and the short-circuiting layer 8.

The channel part 21 may be defined using the edge of the gate 4 as a mask in known manner during a D-MOS type double diffusion or SIPMOS type double implantation for the region 20 and the regions 10 and 15. The region 20 is first formed by doping the layer 30 with acceptor dopant at the windows defined by the mesh-shaped gate 4 which may be of polycrystalline silicon. A concentric masking pattern is then provided within these windows to mask the parts 22 and 23 against the donor doping used to form the region 10 and 15. Thus, the outer edge of both the source region 10 and the p-type region 20 are defined by the edge of the gate 4 whereas the inner edge of the source region 10 and both the outer and inner edge of the emitter region 15 are defined by the edges of the concentric masking pattern.

After removing this concentric masking pattern, the short-circuiting layers 8 and 9 are provided at contact windows in the insulating layer on the region 20 and regions 10 and 15 to short-circuit the p-n junctions between the source region 10 and intermediate part 22 and between the emitter region 15 and further part 23. This may be achieved by metal layers deposited on the major surface of the body 1 in contact with appropriate areas of the region 10 and part 22 and the region 15 and part 23. However in the particular form illustrated by way of example in FIG. 2, the short-circuiting conductive layers 8 and 9 are metal silicide regions formed by reacting a suitable metal (for example platinum) with the silicon surface of the body 1 at the appropriate areas at the edge of the p-n junctions between the region 10 and part 22 and the region 15 and part 23. The use of such metal-silicide short-circuits formed in the body surface is especially convenient for annular geometry devices in which the source electrode extends as an insulated high-level metallization over the gate 4 and short-circuit 8, because it reduces steps in the insulated multi-level contact structure. The same metal can be deposited in contact with the gate 4 and so can react with the polycrystalline silicon to form a metal-silicide gate 4 in the same process steps as are used to form the metal-silicide layers 8 and 9. In this manner the gate resistance can be reduced.

Many modifications are possible within the scope of the present invention. Thus, instead of an annular configuration as illustrated in FIG. 1, the cross-section of FIG. 2 may be realized in an interdigitated geometry having elongate emitter and source regions 15 and 10 and p-type regions 20 which extend parallel to each other in a direction perpendicular to the plane of the paper. In this case, it is not necessary for the source electrode layer 2 to extend over the gate 4, and the source electrode layer 2 and the gate 4 may themselves be interdigitated.

Instead of the channel part 21 adjoining the upper major surface of the body 1, it may adjoin the side wall of a groove which is etched in the major surface to reach the drain-drift region 30 and on the side wall of which the insulated gate structure 4,5 is formed. The groove may have a V-shaped cross-section, thus forming a V-MOS transistor. The bottom of the V-groove may be flat, or a modification of the V-MOST structure may be used having a U-shaped groove.

Instead of using a metal-silicide or metal layer to provide the short-circuits of the p-n junctions of the source and emitter regions 10 and 15 at 8 and 9, the p-n junctions may be locally damaged, for example by ion implantation, at these areas 8 and 9 in order to connect the region 10 to the part 22 and the region 15 to the part 23. Furthermore the short-circuit 8 may be formed in a different process step and in a different manner than the short-circuit 9, and the short-circuit 9 may even be formed by an appropriate source electrode layer 2 contacting sufficiently doped surface areas of the region 15 and part 23.

Instead of a vertical configuration, a lateral transistor structure may be used with a local drain region 31 at the same major surface of the low-doped region 30 as the regions 10, 15 and 20. In this case, if the gate 4 extends laterally from the n-type source region 10 to the local n-type drain region 31, the low-doped region 30 may be either lightly-doped p-type or n-type.

Although the specific embodiments so far described by way of example are n-channel field-effect transistors, all the conductivity-types of the various regions may be reversed to form p-channel transistors.

What I claim is:

1. An insulated-gate field-effect transistor comprising a semiconductor body having a surface-adjacent source region of one conductivity type which is surrounded in the body by a surface-adjacent second region of the opposite conductivity type, a third region adjoining the second region and having a lower conductivity type determining doping concentration, and a drain region adjoining said third region and on the opposite side of said third region from said second region, at least a part of said second and third regions being located in a main current path from the source region to the drain region of the transistor, an insulating layer on said part of at least the second region and a conductive layer on that portion of the insulating layer over said part to form an insulated gate of the transistor for capacitively controlling in said part a conductive channel in the main current path between the source region and the drain region, a surface-adjacent emitter region of said one conductivity type surrounded in the body by the second region, said emitter region being located at a side of the source region remote from the channel part of the second region and being separated from the source region by an intermediate part of the second region, the source region being electrically connected to said intermediate part, and a resistive current path in the second region being present below the emitter region, said resistive current path extending from said intermediate part to a further surface-adjacent part of the second region which is electrically connected to the emitter region, a source electrode being electrically connected to said further surface-adjacent part of the second region so as to be electrically connected via said resistive current path to the source region, and the emitter region comprising means for modulating the conductivity of the third region during operation by charge-carrier injection from said intermediate part of the second region when the source-drain current along the resistive current path is sufficient to forward-bias said intermediate part with respect to the third region, said further surface-adjacent part of the second region being laterally surrounded by the emitter region, which is laterally surrounded in the second region by the source region.

2. A transistor as claimed in claim 1 wherein the further part of the second region is electrically connected to the emitter region by a short-circuiting conductive layer at an edge of the p-n junction between the emitter region and said further surface-adjacent part of the second region.

3. A transistor as claimed in claim 1, wherein the source region is electrically connected to said intermediate part of the second region by a short-circuiting conductive layer at an edge of the p-n junction between the source region and said intermediate part of the second region.

4. A transistor as claimed in claim 2 or 3, wherein the semiconductor body is of silicon, and a metal-silicide region formed at the body surface provides said short-circuiting conductive layer or layers.

5. A transistor as claimed in claim 4, wherein the conductive layer forming the gate of the transistor comprises the same metal-silicide as said region which provides said short-circuiting conductive layer.

6. A transistor as claimed in claim 1, wherein the emitter and source regions have substantially the same doping concentration and thickness.

7. A transistor as claimed in claim 1, wherein the emitter and source regions and the second region adjoin one major surface of the semiconductor body, in that said third region is a low-doped region of said one conductivity type, and in that a drain region which is more highly doped than the third region is present between the third region and the opposite major surface of the body.

8. A transistor as claimed in claim 7, wherein the insulated gate is present on a part of the second region at said one major surface of the body.

* * * * *